United States Patent
Lee et al.

(10) Patent No.: US 9,431,619 B2
(45) Date of Patent: Aug. 30, 2016

(54) COMPOSITION FOR INSULATOR, INSULATOR, AND THIN FILM TRANSISTOR

(71) Applicant: Samsung Electronics Co., Ltd., Suwon-Si, Gyeonggi-Do (KR)

(72) Inventors: Eun Kyung Lee, Seoul (KR); Ji Young Jung, Seoul (KR); Joo Young Kim, Hwaseong-si (KR); Jeong Il Park, Seongnam-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 14/445,862

(22) Filed: Jul. 29, 2014

(65) Prior Publication Data

US 2015/0090979 A1   Apr. 2, 2015

(30) Foreign Application Priority Data

Sep. 27, 2013 (KR) .................. 10-2013-0115353
Jun. 24, 2014 (KR) .................. 10-2014-0077501

(51) Int. Cl.
*H01L 51/05* (2006.01)

(52) U.S. Cl.
CPC .................. *H01L 51/0537* (2013.01)

(58) Field of Classification Search
CPC .... C08G 77/20; C08G 77/14; H01L 51/0537
See application file for complete search history.

(56) References Cited

U.S. PATENT DOCUMENTS

| 8,017,245 | B2 | 9/2011 | Lee et al. |
| 8,043,701 | B2 | 10/2011 | Edelmann et al. |
| 8,153,267 | B2 | 4/2012 | Jeong et al. |
| 2002/0098243 | A1 | 7/2002 | Edelmann et al. |
| 2005/0259212 | A1 | 11/2005 | Lee et al. |
| 2006/0063002 | A1 | 3/2006 | Edelmann et al. |
| 2006/0147715 | A1 | 7/2006 | Lee et al. |
| 2007/0085113 | A1 | 4/2007 | Wu et al. |
| 2007/0145357 | A1 | 6/2007 | Wu et al. |
| 2008/0166493 | A1* | 7/2008 | Xiao ............ C09D 5/1606 427/447 |
| 2011/0001190 | A1 | 1/2011 | Ide et al. |
| 2011/0068417 | A1 | 3/2011 | Murase et al. |
| 2012/0132346 | A1 | 5/2012 | Chen et al. |

FOREIGN PATENT DOCUMENTS

| JP | 2002265870 A | 9/2002 |
| JP | 2007122029 A | 5/2007 |
| JP | 2011186069 A | 9/2011 |
| KR | 20050036171 A | 4/2005 |
| KR | 20080002542 A | 1/2008 |
| KR | 100884357 B1 | 2/2009 |
| KR | 20100026154 A | 3/2010 |
| KR | 20100126407 A | 12/2010 |
| KR | 20110101073 A | 9/2011 |
| KR | 20110106429 A | 9/2011 |
| WO | WO-2009116373 A1 | 9/2009 |

OTHER PUBLICATIONS

H.-J. Gläsal, Radiation-cured polymeric nanocomposites of enhanced surface-mechanical properties, 2003, 303-308 pages, Elsevier B.V.
Jérôme Douce, Effect of filler size and surface condition of nano-sized silica particles in polysiloxane coatings, May 2004, 114-122 pages, Elsevier B.V.
Ying-Ling Liu, Poly(dimethylsiloxane) Star Polymers Having Nanosized Silica Cores, Macromol. Rapid Commun., Jun. 2004, 1392-1395 pages, WILEY-VCH Verlag GmbH & Co. KGaG, Weinheim.
Anubha Goyal, Metal salt induced synthesis of hybrid metal core-siloxane shell nanoparticles and siloxane nanowires, Chem. Commun., Jan. 2010, 964-966 pages, The Royal Society of Chemistry.
Hwa Sung Lee, Interpenetrating polymer network dielectrics for high-performance organic field-effect transistors, Journal of Materials Chemistry, Mar. 2011, 6968-6974 pages, The Royal Society of Chemistry.
Sunho Jeong, Photopatternable Organosiloxane-Based Inorganic-Organic $SiO_2$—$ZrO_2$ Hybrid Dielectrics for Organic Thin Film Transistors, The Journal of Physical Chemistry Letters, Sep. 2007, 16083-16087 pages, American Chemical Society.

* cited by examiner

*Primary Examiner* — Kuo-Liang Peng
(74) *Attorney, Agent, or Firm* — Harness, Dickey & Pierce, P.L.C.

(57) ABSTRACT

An insulating composition includes a nanoparticle-polyorganosiloxane composite, a cross-linking agent, and a solvent, an insulator includes the insulating composition, and an electronic device includes the insulator.

19 Claims, 6 Drawing Sheets

COMPOSITION FOR INSULATOR, INSULATOR, AND THIN FILM TRANSISTOR

CROSS REFERENCE TO RELATED APPLICATION

This application claims priority to and the benefit of Korean Patent Application Nos. 10-2013-0115353 and 10-2014-0077501 filed in the Korean Intellectual Property Office on Sep. 27, 2013, and Jun. 24, 2014, respectively, the entire contents of each which are incorporated herein by reference.

BACKGROUND

1. Field

Example embodiments relate to an insulating composition, an insulator including the same, and a thin film transistor including the insulator.

2. Description of the Related Art

A flat panel display (e.g., a liquid crystal display (LCD), an organic light emitting diode (OLED) display, and/or an electrophoretic display) includes a pair of electric field-generating electrodes and an electrical optical active layer interposed therebetween. The liquid crystal display (LCD) includes a liquid crystal layer as an electric optical active layer, and the organic light emitting diode (OLED) display includes an organic emission layer as an electrical optical active layer.

One of the pair of the electric field-generating electrodes is commonly connected to a switching device and receives an electrical signal, and the electrical optical active layer transforms the electrical signal into an optical signal and thus displays an image.

The flat panel display includes a thin film transistor panel having a thin film transistor (TFT), which is a three-terminal element as a switching device, a gate line transmitting a scan signal for controlling the thin film transistor, and a data line transmitting a signal applied to a pixel electrode.

The thin film transistor may have characteristics, for example, mobility, a leakage current, and an Ion/Ioff ratio, and/or performance of a gate insulator, determined by various factors.

SUMMARY

Example embodiments provide an insulating composition applied as a gate insulator having high reliability.

Example embodiments provide an insulator formed of the insulating composition.

Example embodiments provide a thin film transistor including the insulator.

According to example embodiments, an insulating composition may include a nanoparticle-polyorganosiloxane composite, a cross-linking agent, and a solvent.

The nanoparticle-polyorganosiloxane composite may include a nanoparticle and a polyorganosiloxane chemically bonded in a three-dimensional network structure. The nanoparticle-polyorganosiloxane composite may have a core-shell structure including a nanoparticle and a polyorganosiloxane surrounding the nanoparticle.

The nanoparticle-polyorganosiloxane composite may be obtained through a condensation/polymerization reaction of the nanoparticle in a sol state with at least one silicon monomer. A nanoparticle of the nanoparticle-polyorganosiloxane composite may include a metal oxide. The metal oxide may be one of silica, titania, barium titanate, zirconia, barium sulfate, alumina, hafnium oxide, and a combination thereof.

A polyorganosiloxane of the nanoparticle-polyorganosiloxane composite may include a functional group that is capable of reacting with the cross-linking agent. A polyorganosiloxane of the nanoparticle-polyorganosiloxane composite includes one of a photopolymerizable functional group, a thermally polymerizable functional group, and a combination thereof.

The polyorganosiloxane of the nanoparticle-polyorganosiloxane composite may be represented by the following Chemical Formula 1.

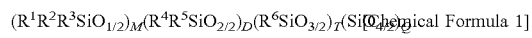

$$(R^1R^2R^3SiO_{1/2})_M(R^4R^5SiO_{2/2})_D(R^6SiO_{3/2})_T(SiO_{4/2})_Q \quad [\text{Chemical Formula 1}]$$

In the above Chemical Formula 1, $R^1$ to $R^6$ may each be independently one of hydrogen, a substituted or unsubstituted $C_1$ to $C_{30}$ alkyl group, a substituted or unsubstituted $C_3$ to $C_{30}$ cycloalkyl group, a substituted or unsubstituted $C_6$ to $C_{30}$ aryl group, a substituted or unsubstituted $C_7$ to $C_{30}$ arylalkyl group, a substituted or unsubstituted $C_1$ to $C_{30}$ heteroalkyl group, a substituted or unsubstituted $C_2$ to $C_{30}$ heterocycloalkyl group, a substituted or unsubstituted $C_2$ to $C_{30}$ alkenyl group, a substituted or unsubstituted $C_2$ to $C_{30}$ alkynyl group, a substituted or unsubstituted $C_1$ to $C_{30}$ alkoxy group, a substituted or unsubstituted $C_1$ to $C_{30}$ epoxy group, a substituted or unsubstituted $C_1$ to $C_{30}$ carbonyl group, a hydroxy group, and a combination thereof, $0 \le M < 1$, $0 \le D < 1$, $0 \le T < 1$, $0 \le Q < 1$, and $M+D+T+Q=1$.

At least one of the $R^1$ to $R^6$ may be one of a substituted or unsubstituted $C_2$ to $C_{30}$ alkenyl group, a substituted or unsubstituted $C_1$ to $C_{30}$ epoxy group, and a combination thereof. The nanoparticle-polyorganosiloxane composite may have an average particle diameter of about 2 nm to about 200 nm.

The cross-linking agent may include one of a photo cross-linking agent, a thermal cross-linking agent, and a combination thereof. The insulating composition may further include at least one of a photo initiator, a photo acid generator, and a dispersing agent.

The cross-linking agent may be included in an amount of about 1 to about 50 parts by weight based on 100 parts by weight of the nanoparticle-polyorganosiloxane composite.

According to example embodiments, an insulator may include the insulating composition.

According to example embodiments, a thin film transistor may include a gate electrode, a semiconductor overlapping the gate electrode, the insulator between the gate electrode and the semiconductor, and a source electrode and a drain electrode electrically connected to the semiconductor.

The semiconductor may be an organic semiconductor.

DETAILED DESCRIPTION

Figure 1:
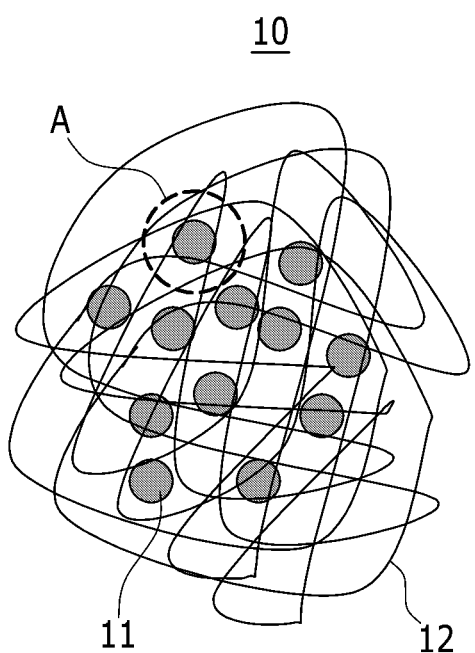
FIG. 1 is a schematic view showing a nanoparticle-polyorganosiloxane composite according to example embodiments.

The present disclosure will be described more fully hereinafter with reference to the accompanying drawings, in which example embodiments are shown. However, this disclosure may be embodied in many different forms and is not construed as limited to the example embodiments set forth herein.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it may be directly on the other element or intervening elements may also be present. In contrast, when an element is referred to as being "directly on" another element, there are no intervening elements present.

It should be understood that, although the terms first, second, third, etc. may be used herein to describe various elements, components, regions, layers and/or sections, these elements, components, regions, layers, and/or sections should not be limited by these terms. These terms are only used to distinguish one element, component, region, layer, or section from another region, layer, or section. Thus, a first element, component, region, layer, or section discussed below could be termed a second element, component, region, layer, or section without departing from the teachings of example embodiments.

Spatially relative terms (e.g., "beneath," "below," "lower," "above," "upper," and the like) may be used herein for ease of description to describe one element or feature's relationship to another element(s) or feature(s) as illustrated in the figures. It should be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" may encompass both an orientation of above and below. The device may be otherwise oriented (rotated 90 degrees or at other orientations) and the spatially relative descriptors used herein interpreted accordingly.

The terminology used herein is for the purpose of describing various embodiments only and is not intended to be limiting of example embodiments. As used herein, the singular forms "a," "an," and "the" are intended to include the plural forms as well, unless the context clearly indicates otherwise. It will be further understood that the terms "includes," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the shapes of regions illustrated herein but are to include deviations in shapes that result, for example, from manufacturing.

Unless otherwise defined, all terms (including technical and scientific terms) used herein have the same meaning as commonly understood by one of ordinary skill in the art to which example embodiments belong. It will be further understood that terms, including those defined in commonly used dictionaries, should be interpreted as having a meaning that is consistent with their meaning in the context of the relevant art and will not be interpreted in an idealized or overly formal sense unless expressly so defined herein.

Hereinafter, an insulating composition according to example embodiments is described. An insulating composition according to example embodiments includes a nanoparticle-polyorganosiloxane composite, a cross-linking agent, and a solvent.

Figure 2:
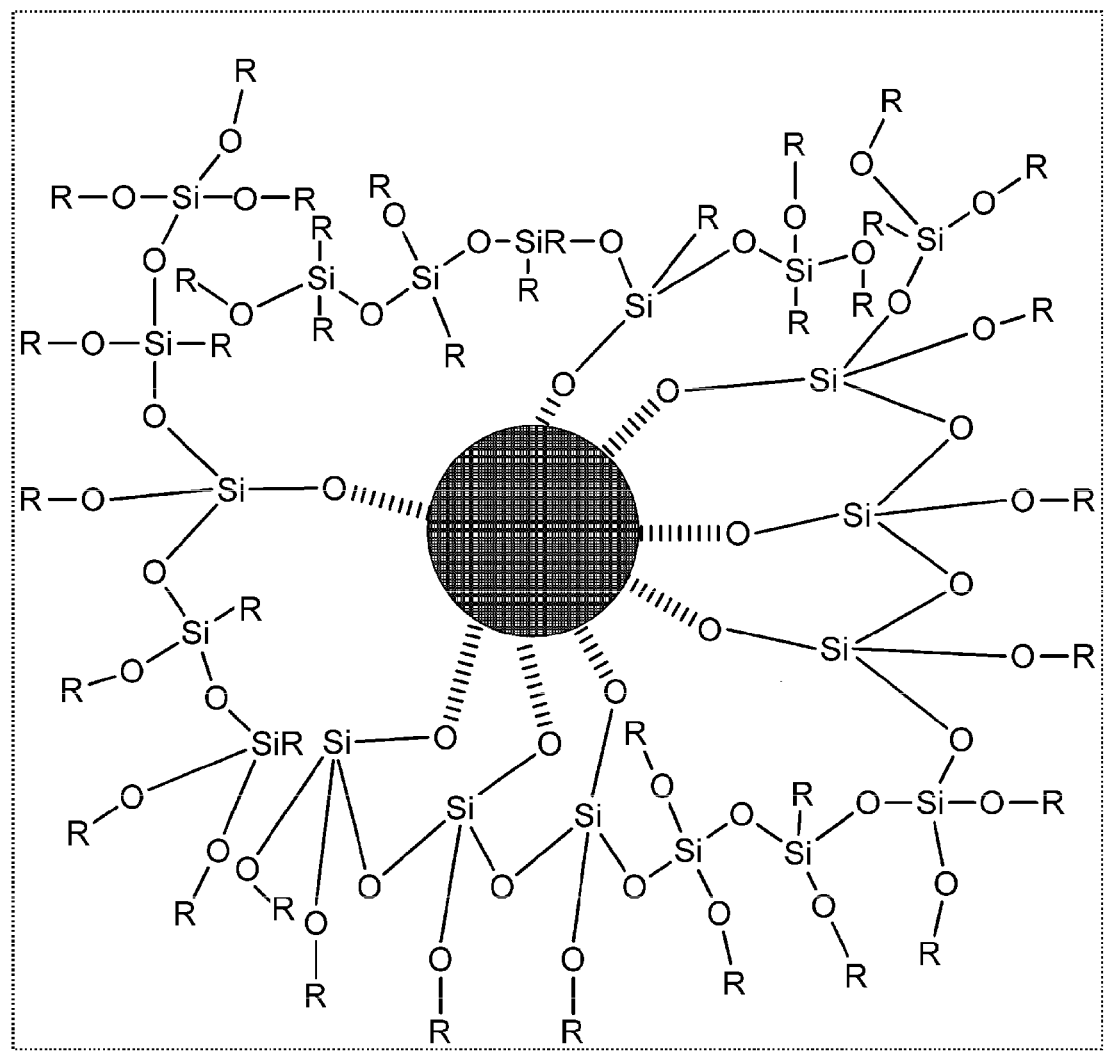
FIG. 2 is a schematic view enlarging a region "A" in FIG. 1.

The nanoparticle-polyorganosiloxane composite is a material forming a three dimensional network structure through a chemical bond between the nanoparticle and the polyorganosiloxane, for example, a structure shown in FIGS. 1 and 2.

FIG. 1 is a schematic view showing a nanoparticle-polyorganosiloxane composite according to example embodiments, and FIG. 2 enlarges a region "A" in FIG. 1.

Referring to FIG. 1, a nanoparticle-polyorganosiloxane composite 10 according to example embodiments includes a plurality of nanoparticles 11 and polyorganosiloxane 12 chemically bonded with each nanoparticle 11 and randomly disposed therein. The nanoparticle 11 may have, for example, a spherical shape, and the polyorganosiloxane 12 may include a chain structure and/or a net structure. The nanoparticle 11 and the polyorganosiloxane 12 form a three-dimensional network structure through a chemical bond.

Referring to FIG. 2, each nanoparticle 11 has a plurality of bonding sites and is chemically bonded with the polyorganosiloxane 12. For example, each nanoparticle-polyorganosiloxane composite 10 may have a core-shell structure where the polyorganosiloxane 12 surrounds the nanoparticle 11, but is not limited thereto.

The nanoparticle-polyorganosiloxane composite 10 may be, for example, obtained through a condensation/polymerization reaction of nanoparticles in a sol state (hereinafter referred to as a "'nano sol") with at least one silicon monomer.

The nano sol may have reaction sites on the surface of the nano particles, and for example, at least one hydroxy group, alkoxy group, halogen, carboxyl group, or combination thereof capable of causing the condensation reaction.

The nanoparticles have no particular limit as long as the particles have an average particle diameter of several to tens of nanometers, and may be, for example, a metal oxide. The metal oxide may be, for example, silica, titania, barium titanate, zirconia, sulfuric acid, barium, alumina, hafnium oxide, or a combination thereof, but is not limited thereto.

The silicon monomer may be a substituted or unsubstituted silane monomer, for example, at least one monomer represented by $R^1R^2R^3SiZ^1$, at least one monomer represented by $R^4R^5SiZ^2Z^3$, at least one monomer represented by $R^6SiZ^4Z^5Z^6$, and/or at least one monomer represented by $SiZ^7Z^8Z^9Z^{10}$.

Herein, $R^1$ to $R^6$ are independently hydrogen, a substituted or unsubstituted $C_1$ to $C_{30}$ alkyl group, a substituted or unsubstituted $C_3$ to $C_{30}$ cycloalkyl group, a substituted or unsubstituted $C_6$ to $C_{30}$ aryl group, a substituted or unsubstituted $C_7$ to $C_{30}$ arylalkyl group, a substituted or unsubstituted $C_1$ to $C_{30}$ heteroalkyl group, a substituted or unsubstituted $C_2$ to $C_{30}$ heterocycloalkyl group, a substituted or unsubstituted $C_2$ to $C_{30}$ alkenyl group, a substituted or unsubstituted $C_2$ to $C_{30}$ alkynyl group, a substituted or unsubstituted $C_1$ to $C_{30}$ alkoxy group, a substituted or unsubstituted $C_1$ to $C_{30}$ epoxy group, a substituted or unsubstituted $C_1$ to $C_{30}$ carbonyl group, a hydroxy group, or a combination thereof, and $Z^1$ to $Z^{10}$ are independently a $C_1$ to $C_6$ alkoxy group, a hydroxy group, a halogen, a carboxyl group, or a combination thereof.

At least one of the $R^1$ to $R^6$ may include a photopolymerizable functional group, a thermally polymerizable functional group, or a combination thereof, for example, at least one substituted or unsubstituted $C_2$ to $C_{30}$ alkenyl group, at least one substituted or unsubstituted $C_1$ to $C_{30}$ alkoxy group, or a combination thereof.

The silicon monomer may have a condensation-polymerization reaction with reaction sties of the nano sol and is bonded therewith, and simultaneously, may form a polyorganosiloxane having a chain and/or network structure through hydrolysis and condensation-polymerization among themselves. Accordingly, the nanoparticle and the polyorganosiloxane may be chemically bonded, obtaining a nanoparticle-polyorganosiloxane composite having a network structure.

The polyorganosiloxane of the nanoparticle-polyorganosiloxane composite may have, for example, a structure represented by the following Chemical Formula 1.

$$(R^1R^2R^3SiO_{1/2})_M(R^4R^5SiO_{2/2})_D(R^6SiO_{3/2})_T(SiO_{4/2})_Q \quad \text{[Chemical Formula 1]}$$
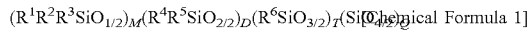

In the above Chemical Formula 1, $R^1$ to $R^6$ are independently hydrogen, a substituted or unsubstituted $C_1$ to $C_{30}$ alkyl group, a substituted or unsubstituted $C_3$ to $C_{30}$ cycloalkyl group, a substituted or unsubstituted $C_6$ to $C_{30}$ aryl group, a substituted or unsubstituted $C_7$ to $C_{30}$ arylalkyl group, a substituted or unsubstituted $C_1$ to $C_{30}$ heteroalkyl group, a substituted or unsubstituted $C_2$ to $C_{30}$ heterocycloalkyl group, a substituted or unsubstituted $C_2$ to $C_{30}$ alkenyl group, a substituted or unsubstituted $C_2$ to $C_{30}$ alkynyl group, a substituted or unsubstituted $C_1$ to $C_{30}$ alkoxy group, a substituted or unsubstituted $C_1$ to $C_{30}$ epoxy group, a substituted or unsubstituted $C_1$ to $C_{30}$ carbonyl group, a hydroxy group, or a combination thereof, $0 \leq M < 1$, $0 \leq D < 1$, $0 \leq T < 1$, $0 \leq Q < 1$, and $M + D + T + Q = 1$.

The polyorganosiloxane of the nanoparticle-polyorganosiloxane composite may include a photopolymerizable functional group, a thermally polymerizable functional group, or a combination thereof and at least one of $R^1$ to $R^6$ like the above monomer. For example, at least one of $R^1$ to $R^6$ may include a substituted or unsubstituted $C_2$ to $C_{30}$ alkenyl group, at least one substituted or unsubstituted $C_1$ to $C_{30}$ alkoxy group, or a combination thereof.

The photopolymerizable functional group and/or the thermally polymerizable functional group are bonded with a previously-described cross-linking agent through photo-curing or thermal curing, and may form a denser network structure during formation of a thin film.

The nanoparticle-polyorganosiloxane composite may have a larger average particle diameter than the nanoparticle, and for example, may have an average particle diameter of about 2 nm to about 200 nm.

The cross-linking agent may include, for example, a photo cross-linking agent, a thermal cross-linking agent, or a combination thereof. The photo cross-linking agent may be, for example, a (meth)acrylate compound (e.g., pentaerythritoltriacrylate). The thermal cross-linking agent may be, for example, an ether compound (e.g., trimethylolpropanetriglycidylether, 1,4-butanedioldivinylether, tri(ethylene glycol)divinylether, trimethylolpropanetrivinylether, 1,4-cyclohexanedimethanoldivinylether, or a combination thereof).

The solvent is not particularly limited, and may be, for example, an aliphatic hydrocarbon solvent (e.g., hexane); an aromatic hydrocarbon solvent (e.g., anisole, mesitylene, and/or xylene); a ketone based solvent (e.g., methylisobutylketone, 1-methyl-2-pyrrolidinone, and/or acetone); an ether based solvent (e.g., cyclohexanone, tetrahydrofuran, and/or isopropylether); an acetate based solvent (e.g., ethylacetate, butylacetate, and/or propylene glycolmethyletheracetate); an alcohol-based solvent (e.g., isopropylalcohol and/or butanol); an amide-based solvent (e.g., dimethylacetamide and/or dimethylformamide); a silicone-based solvent; or a combination thereof.

The cross-linking agent may be included in an amount of about 1 to about 50 parts by weight based on 100 parts by weight of the nanoparticle-polyorganosiloxane composite, and specifically, about 10 to about 50 parts by weight within the range. The nanoparticle-polyorganosiloxane and the cross-linking agent may be included in an amount of about 5 to about 70 wt % based on the total amount of the insulating composition including the solvent, and specifically, about 5 to about 50 wt % within the range.

The insulating composition may further include at least one of a photo initiator, a photo acid generator, and a dispersing agent.

The insulating composition is coated and cured on a substrate or a lower layer into an insulator.

The insulator is an organic/inorganic composite insulator and has improved insulation strength, dielectric constant, and heat and chemical resistance compared with an organic insulator. In addition, the insulator as an organic/inorganic composite insulator may be simply formed in a solution process, unlike an inorganic insulator.

Furthermore, the insulator includes a nanoparticle-polyorganosiloxane composite having a three-dimensional network structure, and may form a more uniform and rigid film compared with the organic/inorganic composite insulator in which nanoparticles are simply dispersed in a polymer. In addition, the insulator may form a denser and more rigid film having a network structure due to a cross-linking bond between the nanoparticle-polyorganosiloxane composite and the cross-linking agent. Accordingly, when the insulator is used as a gate insulator for a thin film transistor, a leakage current may be reduced due to improved film properties and relatively high insulation strength, and characteristics of the thin film transistor may be improved.

The insulator may be used in a field requiring insulation characteristics of an electronic device, for example, as a gate insulator, a dielectric material, and/or a filler.

Figure 3:
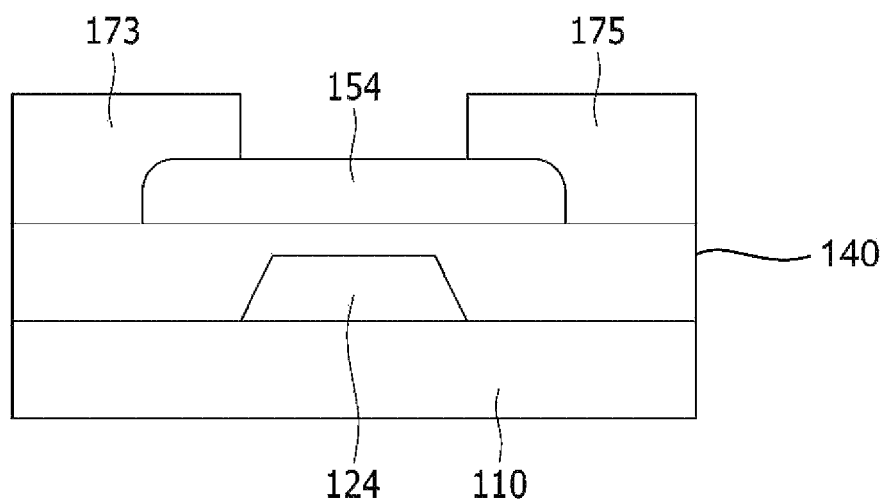
FIG. 3 is a cross-sectional view showing a thin film transistor panel according to example embodiments.

Hereinafter, a thin film transistor including the insulator is described. FIG. 3 is a cross-sectional view showing a thin film transistor according to example embodiments.

Referring to FIG. 3, a thin film transistor according to example embodiments includes a gate electrode 124 disposed on a substrate 110, a semiconductor 154 overlapping the gate electrode 124, a gate insulator 140 interposed between the gate electrode 124 and the semiconductor 154, and a source electrode 173 and a drain electrode 175 that are electrically connected to the semiconductor 154.

The substrate 110 may be made of, for example, transparent glass, silicon, or a polymer. The gate electrode 124 is connected to a gate line (not shown) transmitting a data signal, and may be made of, for example, gold (Au), copper (Cu), nickel (Ni), aluminum (Al), molybdenum (Mo), chromium (Cr), tantalum (Ta), titanium (Ti), an alloy thereof, and a combination thereof, but is not limited thereto.

The semiconductor 154 may be an organic semiconductor or an inorganic semiconductor, and is, for example, an organic semiconductor. The organic semiconductor may be, for example, at least one selected from pentacene and a precursor thereof, tetrabenzoporphyrin and a derivative thereof, polyphenylenevinylene and a derivative thereof, polyfluorene and a derivative thereof, polythienylenevinylene and a derivative thereof, polythiophene and a derivative thereof, polythienothiophene and a derivative thereof, polyarylamine and a derivative thereof, phthalocyanine and a derivative thereof, metallized phthalocyanine and a halogenated derivative thereof, perylenetetracarboxylic dianhydride (PTCDA), naphthalenetetracarboxylic dianhydride (NTCDA) or an imide derivative thereof, perylene or coronene and substituent-containing derivatives thereof, but is not limited thereto.

The gate insulator 140 may be formed of the above insulating composition, for example, by coating the above insulating composition and then photo-curing and/or thermally curing it.

The source electrode 173 and the drain electrode 175 face each other with the semiconductor 154 therebetween, and are electrically connected to semiconductor 154. The source electrode 173 is connected to a data line (not shown) transmitting a data signal. The source electrode 173 and the drain electrode 175 may be, for example, made of gold (Au), copper (Cu), nickel (Ni), aluminum (Al), molybdenum (Mo), chromium (Cr), tantalum (Ta), titanium (Ti), an alloy thereof and a combination thereof, but are not limited thereto.

The thin film transistor may be applied to various electronic devices, for example, a semiconductor device, a flat panel display, an energy device, and a sensor. The electronic device may include, for example, a liquid crystal display (LCD), an organic light emitting diode (OLED) device, a solar cell, and an organic sensor.

Hereinafter, the present disclosure is illustrated in more detail with reference to examples. However, these are examples, and the present disclosure is not limited thereto.

Synthesis of Nanoparticle-Polyorganosiloxane Composite

Synthesis Example 1

500 g of an aqueous alkaline silica sol is passed through a column charged with a strongly acidic cation exchange resin, obtaining an acidic silica sol having pH 2. 500 g of the acidic silica sol is put in a reactor equipped with a reflux cooler that is capable of agitation and made of a glass material, 1000 g of methanol is added thereto, and the mixture is diluted. Subsequently, 11 g of glycidoxypropyltrimethoxysilane is added thereto, the mixture is agitated at room temperature for 1 hour, and then heated and reacted at 95° C. for 6 hours to perform a silica surface treatment. Then, the surface-treated silica sol is distillated under a reduced pressure of 50 cm Hg at 80° C. and concentrated to 500 g by removing a part of water included therein. The distillation under reduced pressure is additionally performed four times under the same conditions after diluting the silica sol by adding 1000 g of methanol thereto until the amount of water therein decreases to less than or equal to 1 wt %. Then, 43 g of methyltrimethoxysilane, 89 g of glycidoxypropyltrimethoxysilane, 183 g of 3-(methacryloxypropyl) trimethoxysilane, 86 g of diethoxydiphenylsilane, and 66 g of tetraethoxysilane are added thereto, and the mixture is agitated at room temperature for 1 hour. Following this, 56 g of a hydrochloric acid aqueous solution with a concentration of 0.1 N is added thereto in a dropwise fashion for 2 hours, and the mixture is additionally agitated at room temperature for 2 hours to perform a hydrolysis reaction. The temperature of the resultant is then increased to 80° C. and the resultant is reacted for 36 hours to perform condensation and polymerization, obtaining a silica-polyorganosiloxane composite with silica positioned in the core and polyorganosiloxane condensed and polymerized as a shell around the silica.

Subsequently, 335 g of propylene glycolmonomethylether acetic acid is added to the silica-polyorganosiloxane composite for dilution, and the diluted mixture is distillated under reduced pressure of 60 cm Hg at 60° C. to remove a byproduct, obtaining a silica-polyorganosiloxane composite dispersed in the propylene glycolmonomethyletheracetic acid.

When the silica-polyorganosiloxane composite is measured in a GPC method, its weight average molecular weight is 2200, PDI is 1.2, viscosity is 9.2 cPs at 20° C., and pH is 5.

Preparation of Composition for Insulator

Example 1

0.75 g of pentaerythritol triacrylate and 0.075 g of trimethylpropanetriglycidylether are added to 1.67 g (35 wt %) of the silica-polyorganosiloxane composite dispersed in glycolmonomethyletheracetic acid according to Synthesis Example 1, and the mixture is ball-milled for one hour, preparing an insulating composition.

Comparative Example 1

20 g of methacryloxypropyl trimethoxysilane is put in a flask, a solution obtained by diluting a predetermined or given amount of hydrochloric acid in deionized water (0.001021 mol of hydrochloric acid per cc of water) is added thereto, and the mixture is reacted at room temperature for 30 minutes. Subsequently, 100 ml of tetrahydrofuran and 100 ml of diethylether are added thereto to complete the reaction. The solution is moved to a separatory funnel and then cleaned three times with 30 ml of water, and a volatile material therein is removed under a reduced pressure, obtaining colorless polyorganosiloxane. Subsequently, the polyorganosiloxane and tetrabutoxy titanate ($Ti(OC_4H_9)_4$) as a nanoparticle are mixed in a weight ratio of 70:30, and the mixture is dissolved in butanol, preparing an insulating composition in which the nanoparticles are dispersed in the polyorganosiloxane.

Comparative Example 2

43 g of methyltrimethoxysilane, 89 g of glycidoxypropyltrimethoxysilane, 183 g of 3-(methacryloxypropyl) trimethoxysilane, 86 g of diethoxydiphenylsilane, and 66 g of tetraethoxysilane are put in a flask and agitated at room temperature. Subsequently, 56 g of a hydrochloric acid aqueous solution is added thereto to be in a concentration of 0.1 N in a dropwise fashion for 2 hours, and the mixture is agitated at room temperature for 2 hours to perform a hydrolysis reaction. The resultant is then heated to 80° C.

and maintained at the temperature for 36 hours to perform condensation and polymerization, obtaining a polyorganosiloxane compound. Then, 5.01 g (35 wt %) of the polyorganosiloxane compound dispersed in the propylene glycolmonomethyletheracetic acid, 5.99 g of pentaerythritol triacrylate, and 0.23 g of trimethylpropanetriglycidylether are added thereto, and the mixture is ball-milled for 1 hour, preparing an insulating composition.

Manufacture of Thin Film Transistor

Preparation Example 1

Molybdenum is sputtered on a glass substrate, and then photolithography is performed to form a gate electrode. Subsequently, the insulating composition according to Example 1 is spin-coated thereon, pre-annealed at 90° C. for 2 minutes, and radiated using a 200 W high pressure mercury lamp having a wavelength region of 240 to 400 nm for one minute.

A pentacene derivative is then vacuum-deposited thereon, forming an organic semiconductor. Subsequently, gold (Au) is sputtered on the organic semiconductor, and photolithography is performed to form a source electrode and a drain electrode, manufacturing a thin film transistor.

Comparative Preparation Example 1

A thin film transistor is manufactured according to the same method as Preparation Example 1, except for using the insulating composition according to Comparative Example 1 instead of the insulating composition according to Example 1.

Comparative Preparation Example 2

A thin film transistor is manufactured according to the same method as Preparation Example 1, except for using the insulating composition according to Comparative Example 2 instead of the insulating composition according to Example 1.

Evaluation

Characteristics of the thin film transistors according to Preparation Example 1 and Comparative Preparation Examples 1 and 2 are evaluated. The characteristics of the thin film transistors thin film transistor include insulation strength, charge mobility, and $I_{on}/I_{off}$ ratio.

Figure 4:
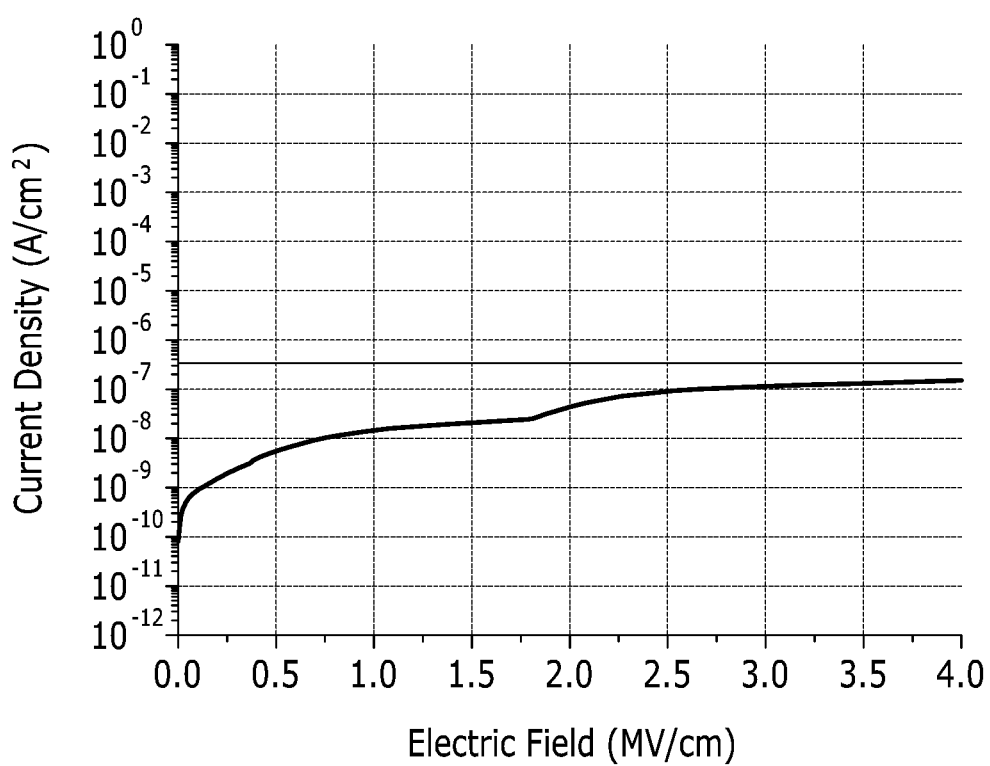
FIG. 4 is a graph showing insulation strength of a thin film transistor according to Preparation Example 1.
Figure 5:
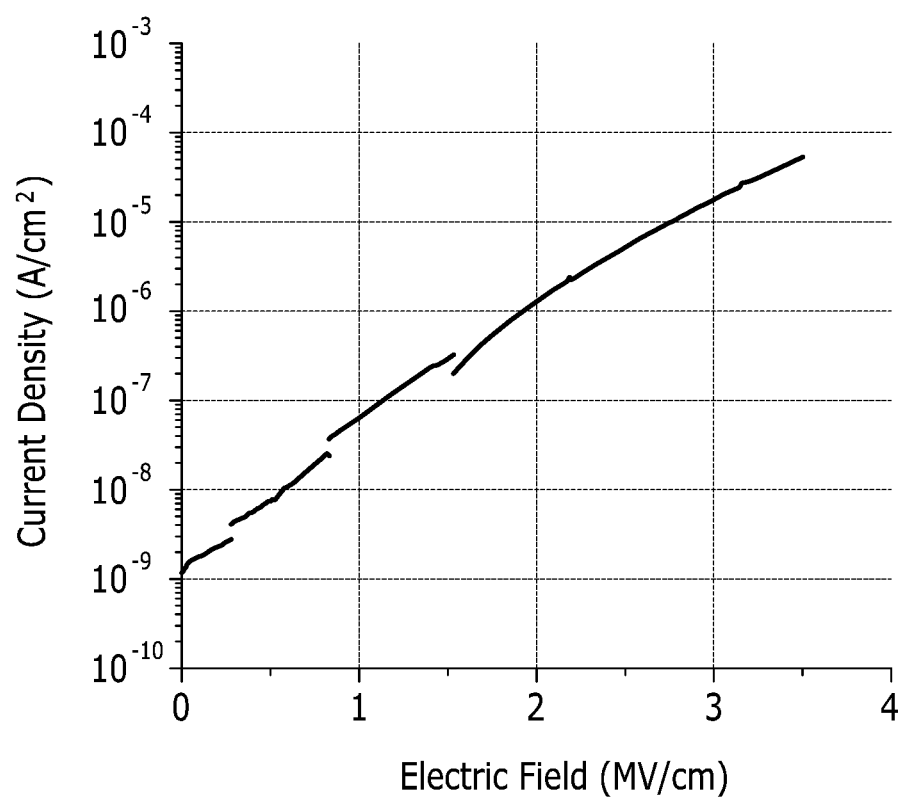
FIG. 5 is a graph showing insulation strength of a thin film transistor according to Comparative Preparation Example 1.
Figure 6:
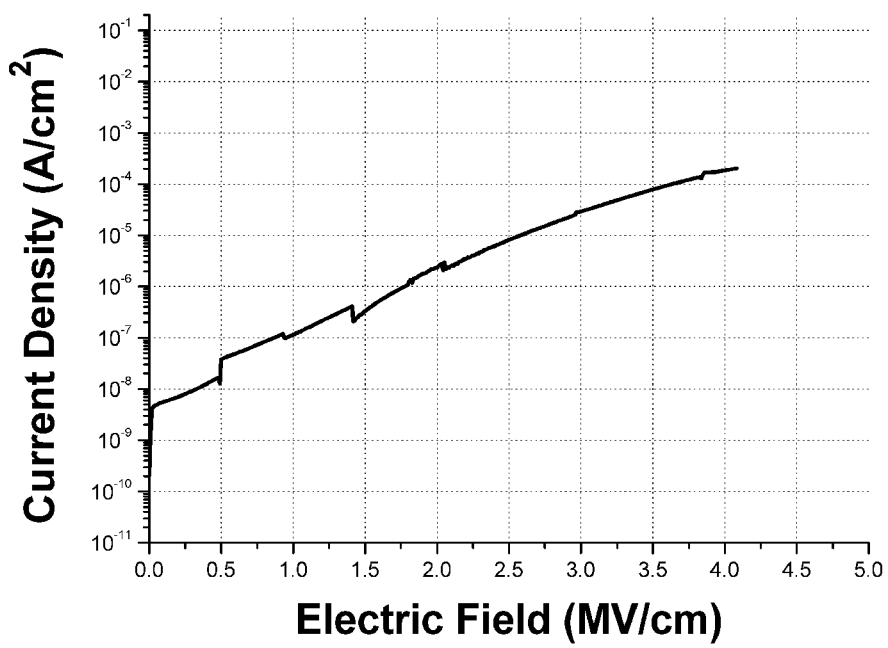
FIG. 6 is a graph showing insulation strength of a thin film transistor according to Comparative Preparation Example 2.

FIG. 4 is a graph showing the insulation strength of the thin film transistor according to Preparation Example 1, FIG. 5 is a graph showing the insulation strength of the thin film transistor according to Comparative Preparation Example 1, and FIG. 6 is a graph showing the insulation strength of the thin film transistor according to Comparative Preparation Example 2.

Referring to FIGS. 4 to 6, the thin film transistor according to Preparation Example 1 shows improved insulation strength and thus higher electrical reliability compared with the thin film transistors according to Comparative Preparation Examples 1 and 2.

The following Table 1 shows charge mobility and $I_{on}/I_{off}$ ratio of the thin film transistors according to Preparation Example 1 and Comparative Preparation Examples 1 and 2.

TABLE 1

| | Charge mobility (cm2/V · s) | $I_{on}/I_{off}$ ratio |
|---|---|---|
| Preparation Example 1 | 1.5 | 6.86 × 10⁶ |
| Comparative Preparation Example 1 | 0.8 | 4.22 × 10⁶ |
| Comparative Preparation Example 2 | 0.9 | 1.5 × 1⁶ |

Referring to Table 1, the thin film transistor according to Preparation Example 1 shows improved charge mobility and $I_{on}/I_{off}$ ratio compared with the thin film transistors according to Comparative Preparation Examples 1 and 2.

While this disclosure has been described in connection with what is presently considered to be practical example embodiments, it is to be understood that the disclosure is not limited to the disclosed embodiments, but, on the contrary, is intended to cover various modifications and equivalent arrangements included within the spirit and scope of the appended claims.

What is claimed is:

1. An insulating composition comprising:
   a nanoparticle-polyorganosiloxane composite having a core-shell structure including a nanoparticle and a polyorganosiloxane surrounding the nanoparticle;
   a cross-linking agent; and
   a solvent wherein the polyorganosiloxane of the nanoparticle-polyorganosiloxane composite includes a functional group that is capable of reacting with the cross-linking agent.

2. The insulating composition of claim 1, wherein the nanoparticle and the polyorganosiloxane of the nanoparticle-polyorganosiloxane composite are chemically bonded in a three-dimensional network structure.

3. The insulating composition of claim 1, wherein the nanoparticle-polyorganosiloxane composite is obtained through a condensation/polymerization reaction of the nanoparticle in a sol state with at least one silicon monomer.

4. The insulating composition of claim 1, wherein the nanoparticle of the nanoparticle-polyorganosiloxane composite includes a metal oxide.

5. The insulating composition of claim 4, wherein the metal oxide includes one of silica, titania, barium titanate, zirconia, barium sulfate, alumina, hafnium oxide, and a combination thereof.

6. The insulating composition of claim 1, wherein the polyorganosiloxane of the nanoparticle-polyorganosiloxane composite includes one of a photopolymerizable functional group, a thermally polymerizable functional group, and a combination thereof.

7. The insulating composition of claim 1, wherein the polyorganosiloxane of the nanoparticle-polyorganosiloxane composite has a structure represented by the following Chemical Formula 1:

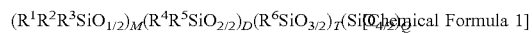

wherein, in the above Chemical Formula 1,
$R^1$ to $R^6$ are each independently one of hydrogen, a substituted or unsubstituted $C_1$ to $C_{30}$ alkyl group, a substituted or unsubstituted $C_3$ to $C_{30}$ cycloalkyl group, a substituted or unsubstituted $C_6$ to $C_{30}$ aryl group, a substituted or unsubstituted $C_7$ to $C_{30}$ arylalkyl group, a substituted or unsubstituted $C_1$ to $C_{30}$ heteroalkyl group, a substituted or unsubstituted $C_2$ to $C_{30}$ heterocycloalkyl group, a substituted or unsubstituted $C_2$ to $C_{30}$ alkenyl group, a substituted or unsubstituted $C_2$ to $C_{30}$ alkynyl group, a substituted or unsubstituted $C_1$ to $C_{30}$ alkoxy group, a substituted or unsubstituted $C_2$ to $C_{30}$ epoxy group, a substituted or unsubstituted $C_1$ to $C_{30}$ carbonyl group, a hydroxy group, and a combination thereof, $$0 \le M < 1, \, 0 \le D < 1, \, 0 \le T < 1, \, 0 \le Q < 1 \text{ and}$$

$$M+D+T+Q=1.$$

8. The insulating composition of claim 7, wherein at least one of the $R^1$ to $R^6$ is one of a substituted or unsubstituted $C_2$ to $C_{30}$ alkenyl group, a substituted or unsubstituted $C_2$ to $C_{30}$ epoxy group, and a combination thereof.

9. An insulator comprising a cured product of the insulating composition of claim 1.

10. A thin film transistor, comprising:
   a gate electrode;
   a semiconductor overlapping the gate electrode;
   the insulator according to claim 9 between the gate electrode and the semiconductor; and
   a source electrode and a drain electrode electrically connected to the semiconductor.

11. The thin film transistor of claim 10, wherein the semiconductor is an organic semiconductor.

12. An insulating composition comprising:
   a nanoparticle-polyorganosiloxane composite having an average particle diameter of about 2 nm to about 200 nm;
   a cross-linking agent; and
   a solvent.

13. The insulating composition of claim 1, wherein the cross-linking agent includes one of a photo cross-linking agent, a thermal cross-linking agent, and a combination thereof.

14. The insulating composition of claim 1, further comprising:
   at least one of a photo initiator, a photo acid generator, and a dispersing agent.

15. The insulating composition of claim 1, wherein the cross-linking agent is included in an amount of about 1 to about 50 parts by weight based on 100 parts by weight of the nanoparticle-polyorganosiloxane composite.

16. The insulating composition of claim 12, wherein the nanoparticle-polyorganosiloxane composite includes a nanoparticle and a polyorganosiloxane chemically bonded in a three-dimensional network structure.

17. The insulating composition of claim 12, wherein the nanoparticle-polyorganosiloxane composite is obtained through a condensation/polymerization reaction of a nanoparticle in a sol state with at least one silicon monomer.

18. An insulator comprising a cured product of the insulating composition of claim 12.

19. A thin film transistor, comprising:
   a gate electrode;
   a semiconductor overlapping the gate electrode;
   the insulator according to claim 18 between the gate electrode and the semiconductor; and
   a source electrode and a drain electrode electrically connected to the semiconductor.

* * * * *